Nov. 23, 1971 A. GEE 3,621,563

METHOD OF TREATING JUNCTION DIODES TO PREVENT TEMPERATURE-VOLTAGE DEGRADATION

Filed April 19, 1968

INVENTOR.
ALLEN GEE,
BY

ATTORNEY.

3,621,563

METHOD OF TREATING JUNCTION DIODES TO PREVENT TEMPERATURE-VOLTAGE DEGRADATION

Allen Gee, Newport Beach, Calif., assignor to Hughes Aircraft Company, Culver City, Calif.

Filed Apr. 19, 1968, Ser. No. 722,724
Int. Cl. B01j *17/00;* H01l *1/10*
U.S. Cl. 29—588 14 Claims

ABSTRACT OF THE DISCLOSURE

Method of preventing temperature-voltage degradation of P-N junction diodes by packaging the diode with a compound which yields phosphorous pentoxide upon being heated.

This invention relates to semiconductor devices and especially to junction-type silicon diodes. More particularly, the invention relates to methods of manufacturing and treating diffused junction-type silicon diodes so as to improve and stabilize their electrical characteristics.

Diffused junction-type silicon diodes comprising a body of N-type silicon having a P-type conductivity region formed in one surface thereof by diffusion of a P-type impurity through a silicon oxide mask are well known. It is also well known to leave the oxide mask in situ on the surface of the silicon body, except for an opening in the mask to permit electrical connection to the diffused region, so as to protect this surface and especially the P-N rectifying junction which terminates at this surface. While the silicon oxide mask is efficacious in protecting the device thus formed and is in many applications, as in microcircuitry or integrated circuit arrangements, the only protection needed, there are other applications where additional protection against mechanical damage or detrimental environments is needed. In order to achieve such additional protection, a silicon junction diode such as briefly described above has been marketed in a hermetically sealed package comprising a small tubular glass envelope and a pair of metallic end caps. Electrical connections between the diode and the end caps are achieved by contacting or bonding the silicon body on the inside surface of one of the end caps and by contacting or bonding the contact from the diffused junction-forming region in the silicon body to the inside surface of the other end cap.

For some reason not as yet clearly understood, it has been found that such an oxide-protected diffused silicon diode is subject to degradation when sealed in a glass package and when operated with a reverse voltage of the order of 50 volts in a temperature range from 90° to 200° C. It is suspected that, under these conditions, ions from the package body glass migrate to and through the oxide and cause an electrical shunt of the rectifying junction where it terminates at the surface of the silicon body. It has been noted also that oxide-protected diodes of this type prior to packaging do not exhibit such degradation at the aforementioned reverse voltage and temperature. The present invention therefore relates to a treating process for such packaged diodes which renders them immune to such degradation after packaging.

Alleviation of this condition has been previously obtained to some extent by heating and exposing the glass body package and/or the oxide-protected semiconductor device to the vapors of phosphorous pentoxide ($P_2O_5$) or by immersing such devices into a solution of phosphorous pentoxide and boric acid. The boric acid acts as a nonhydroscopic carrier for the phosphorous pentoxide to permit ease in handling. While the use of the $P_2O_5$-boric acid treatment is efficacious in obtaining the desired improvement in electrical characteristics, the employment of boric acid has given rise to some difficulties, the most significant of which is poor electrical contact between the metal parts or terminals of the package and the contact portions of the device itself. Since the bonds between these parts are metallurgical, it will be appreciated that any non-metallic films formed thereon will detrimentally affect the nature and strength of such bonds.

It is therefore an object of the invention to provide an improved method for treating glass-packaged oxide-protected diffused junction semiconductor diodes.

Another object of the invention is to provide an improved treatment for preventing and/or reducing high-voltage, high-temperature degradation in glass-packaged oxide-protected diffused junction silicon diodes.

Yet another object of the invention is to provide an improved method for treating glass-packaged oxide-protected diffused junction semiconductor diodes with phosphorous.

These and other objects and advantages of the invention are realized by packaging the oxide-protected semiconductor device such as a diode in a container along with a heat-decomposable source of phosphorous pentoxide such as ammonium phosphate and then heating this source as during the sealing of the package to provide phosphorous pentoxide therewithin. A marked reduction in the temperature-voltage degradation characteristic of diffused junction, oxide-protected devices has been obtained by this treatment. More particularly, the yield of acceptable devices treated by this process is over 90% as compared to yields of 25 to 50% for devices treated by previous methods. Where the heat-decomposable source of phosphorous pentoxide also yields a product (such as hydrogen in the case of ammonium phosphate) another reagent such as ammonium nitrate may be provided in the package so as to react with such detrimental products to form a non-detrimental substance (such as water).

The invention will be described in greater detail by reference to the drawings in which.

Figure 1:
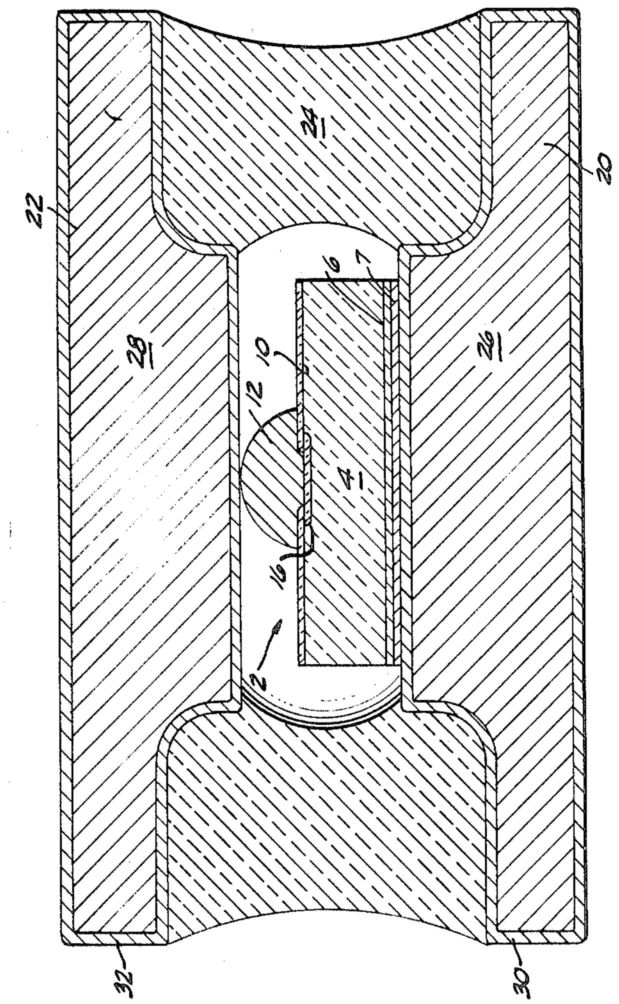
FIG. 1 is a cross-sectional, elevational view of a typical diode device mounted in a hermetic glass package and treated according to the practice of the present invention.

Referring now to the drawings, a typical semi-conductor diode device is shown completely packaged and processed according to the invention. The diode device 2 may comprise, for example, a silicon crystal member 4, the bulk of which may be of N-type conductivity. The "back" surface of the silicon member or die 4 may be provided with a gold-silicon eutectic layer 6 by previous processing, as is well known in the art of semiconductor device fabrication in order to insure a good ohmic connection to the N-type semiconductor die 4. The gold-silicon eutectic layer 6 may be provided by evaporating a thin layer of gold onto the back surface of the silicon body while maintaining this body at the gold-silicon eutectic temperature. Thereafter, by conventional techniques, a thin layer 7 of silver may be electroplated over the gold-silicon layer 6.

The remainder of the diode device 2 comprises a diffused P-type junction-forming region 8 disposed on an upper surface of the semiconductor die 4 with a protective non-conductive coating 10 disposed over portions thereof including especially those portions where the junction 16 between the P-type region 8 and the bulk of the N-type body 4 extends to the surface of the semiconductor die. This junction-forming P-type region 8 is formed prior to assembly of the device 2 in the package by masking the upper surface of the silicon die 4 to form a non-conductive coating 10 as by oxidizing this surface.

A portion of this coating may then be removed, as by etching, to form an opening or window therein. Thereafter the thus masked surface of the semiconductor die is exposed to a diffusion atmosphere containing in vapor form a P-type impurity such as boron, for example. By the process of diffusion, the impurity establishes the P-type region 8 through the opening in the mask. The P-N rectifying junction 16 is thus formed under the protective oxide layer 10 which is left in situ. This process is well known in the art and is fully described in U.S. Pats. 2,802,760 to Derick and Frosch and 3,025,589 to Hoerni.

Electrical contact to the P-type region 8 is provided by means of a metal fill or "bump" 12 through an opening provided in the non-conductive coating 10. Semiconductor devices such as shown are extremely small, the area of the surface of the die member 4 containing the junction-forming region 8 being about 400 sq. mils. In such a device, it is customary that the opening in the non-conductive mask coating 10 be only about 3.5 mils in diameter. Formation of the "bump" 12 to provide electrical connection to the exposed surface of the die member through the window in the non-conductive coating 10 may be achieved by electroplating.

While a single such device may be fabricated on a discrete semiconductor body or die, it has been found more convenient and economical to perform the required fabrication processes on a large wafer of semiconductor material to form a plurality of rectifying junction devices simultaneously and thereafter "dice" the wafer to obtain separate devices or dice. Thus it should be understood that, though the process of the invention is described as being performed on a discrete semiconductor body or die, the practice is by no means limited thereto.

The package or container for the device just described comprises a pair of opposed terminal cap members 20 and 22 sealed together at their peripheries by means of a glass body portion or envelope 24 with the semiconductor device 2 therewithin and therebetween. The cap members 20 and 22 are of metal and are each provided with centrally disposed mesa or pedestal portions 26 and 28, respectively.

A suitable glass for the package shown in FIG. 1 may be a high lead glass identified as "Glass Code 8870" by Corning Glass Works of Corning, N.Y., the manufacturer thereof. The metallic end cap members 20 and 22 may be formed of a glass-sealing metal consisting essentially of an alloy of iron and nickel in equal proportions by weight. During the heating of the glass body 24 in contact with such an alloy element, however, the cap members tend to readily oxidize which would severely reduce the ability to achieve metal-to-metal bonds or soldering action to such end cap members. It has been found advantageous to plate these end cap members with silver so as to inhibit or avoid the deleterious effects of such oxidation of the metal of these cap members while at the same time achieving excellent sealing of the glass body part to these cap members. In addition, the silver plating readily bonds with the metals forming the contact portions or connections on the semiconductor device 2. As shown in the drawings, the end cap members 20 and 22 are provided with platings 30 and 32 by conventional silver electroplating techniques over their entire surfaces which plating may be about 0.0007" in thickness.

The package assembly shown in the drawing is achieved by placing the silicon semiconductor device 2 on the pedestal portion 26 of an end cap member 20 with the silver-plated layer 7 of the semiconductor device 2 being in contact with the silver layer 30 on the mesa portion 26 of the cap member 20. The ring-like glass part 24 is then placed on the peripheral portions of the cap member 20 and the upper cap member 22 is placed with its pedestal portion 28 extending downwardly within the glass member 24. The assembly is then placed in an oven or any other desired heating apparatus and raised to a temperature at which the glass body 24 softens and seals to the metallic cap members 20 and 22. During this sealing operation the glass body 24 loses its heretofore substantially symmetrical, cylindrical shape and tends to slump down to assume more or less the shape shown in the drawing. This slumping down of the glass body 24 permits the upper cap member 22 to drop downwards toward the lower cap member 20 so that the silver-plated pedestal 28 of the upper cap member 22 contacts and bonds to the metal button or "bump" element 12 on the semiconductor device 2. To enhance this action and to ensure that the upper cap member does in fact come down sufficiently to ensure contact to the metal connector 12, it may be desirable to place a weight on the assembly during this heating operation.

Utilizing metal cap members of the aforementioned alloy and a glass body 24 of Corning Glass No. 8870, a hermetically sealed package may be obtained and bonded connections provided between the upper cap member 22 to the connector element 12 and between the lower cap member 20 and the back surface 6 of the semiconductor device by heating the assembly to about 750° C. for two to five minutes.

Figure 3:
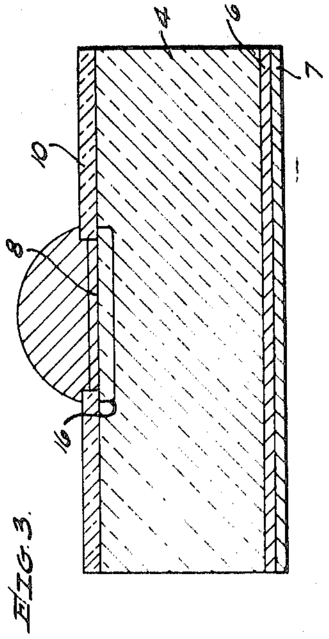
FIG. 3 is a cross-sectional, elevational view of a diode device at one stage in the fabrication thereof.
Figure 2:
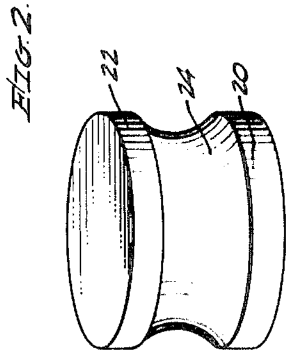
FIG. 2 is an over-all perspective view of the packaged diode device shown in FIG. 1.

Prior to mounting and sealing semiconductor devices in the package just described and shown in FIGS. 1 and 2, the devices are electrically tested and it has been found that almost all devices tested at this stage are capable of operating at a temperature of 200° C. with a reverse voltage of 50 volts or more without degradation. As shown in FIG. 3 the device at this test stage comprises the silicon body 4, the junction-forming region 8 on one surface thereof, an oxide coating or mask 10 on this surface, a metal contact 12 bonded to the junction-forming region 8 through an opening in the oxide mask 10, and a back contact 6, 7 bonded to the opposite surface of the silicon body. Heretofore immediately after mounting and sealing such devices in the package shown and described, a severe degradation in the electrical properties has been noted for a substantial number of devices. Such diodes especially fail to operate and become degraded under the high temperature-high voltage conditions described previously. The reason for such behavior is not known but is generally believed to be due to sodium contamination of the oxide. By the process of the present invention, however, it has been unexpectedly found that such failure may be entirely eliminated or substantially reduced to the point where manufacture of such devices is economically feasible. This improvement in the electrical characteristics of oxide-protected silicon devices of the diffused junction type is achieved by packaging such oxide-protected devices with phosphorous pentoxide. The reason for the "cure" is not fully understood but is believed to be due to immobilization of sodium by phosphorous in the oxide.

In treating the semiconductor devices according to the process of the present invention, the devices such as the device 2 shown in FIG. 3 are placed in a vessel containing a solution of a heat-decomposable source of phosphorous pentoxide which source or compound is also non-hydroscopic and whose reaction products other than phosphorous pentoxide are gaseous. A satisfactory compound for this purpose is ammonium phosphate. This treatment is carried out after the diffusion step described in connection with FIG. 3 has been carried out and after the opening in the oxide layer 10 has been closed by oxidation of the exposed surface to form an oxide coating 10' thereover. Treatment according to the present invention is practiced on a semiconductor device having a junction-forming diffused region 8 in at least one surface of the semiconductor body 4 which surface is completely covered with an oxide layer 10. Because one of the reaction products of the decomposition of ammonium phosphate upon heating is hydrogen as per the equation:

$$2NH_4H_2PO_4 \rightarrow P_2O_5 + N_2\uparrow + 3H_2\uparrow + 3H_2O$$

and because hydrogen is known to decrease the breakdown voltage of planar diode devices, a non-hydroscopic oxidizing agent such as ammonium nitrate is included in the solution. The ammonium nitrate reacts with hydrogen to form water according to the equation:

$$H_2+NH_4NO_3\rightarrow N_2\uparrow+3H_2O$$

The purpose of the immersion step is to obtain a deposition on the diode of the ammonium phosphate salt as well as a sufficient amount of the ammonium nitrate salt to oxidize the hydrogen released during the decomposition of the ammonium phosphate. It will be understood that other techniques for coating the oxide-protected surface with these salts may be available and are within the scope of the present invention. The solution immersion technique, however, has certain advantages and has been found to be extremely practicable in use. This step of the process of the invention may be carried out according to the more detailed description hereinafter set forth. When solution-immersion procedures are employed to provide the desired phosphorous pentoxide source and/or a reagent for rendering harmless any reaction products other than $P_2O_5$, it is desirable to employ non-hydroscopic materials since hydroscopic materials will absorb moisture from the atmosphere and become "sticky," making it difficult to handle the thus-treated devices. This difficulty will be understood when it is considered that it is desirable to simultaneously "batch-process" thousands of devices.

A solution is prepared containing 40 grams per liter of $NH_4H_2PO_4$ and 40 grams per liter of $NH_4NO_3$. These reagents are dissolved in deionized water. Thereafter about 100 ml. of this solution is placed in a container on a hot plate and from 10,000 to 20,000 dice or devices such as shown in FIG. 3 are placed in the solution so as to be completely submerged therein. The dice may be agitated to facilitate "wetting" by the solution. Thereafter the dice are removed from the solution and dried, preferably under an infrared lamp. Upon the conclusion of the drying operation, evidence of satisfactory treatment is the presence of salt-like particles on the dice.

Upon assembly of the device in the package as shown in FIG. 1, the temperature is raised to the aforementioned 750° C. whereupon the ammonium phosphate decomposes so as to provide phosphorous pentoxide within the container to which the oxide layer 10 is exposed. As described previously the hydrogen resulting from this decomposition reacts with the ammonium nitrate to form water which does not deleteriously affect the device characteristics due to the protection of the junction itself.

There thus has been described a novel and useful treatment for diffused junction semiconductor devices having oxide layer or layers thereon protecting the surface at which the rectifying junction is terminated. By processing the devices according to the invention, marked stability in the electrical properties of such devices is realized. Specifically, semiconductor devices treated and packaged as described and shown herein are capable of operating for long periods of time without the aforementioned degradation at 50 volts and at temperatures as high as 200° C.

What is claimed is:

1. In the process of fabricating a semiconductor device having a P-N junction terminating at a surface and under an electrically insulating coating on said surface, the steps of:

(a) depositing on said device a compound capable of yielding phosphorous pentoxide upon being heated to a preedtermined temperature;

(b) assembling said device in a container;

(c) hermetically sealing said device in said container; and (d) heating said compound to said predetermined temperature without raising said device to a temperature at which said phosphorous pentoxide would diffuse therein.

2. The invention according to claim 1 wherein said sealing and heating steps are performed simultaneously.

3. The invention according to claim 1 wherein said sealing step is accomplished by heating said container to a temperature which results in heating at least said compound to said predetermined temperature.

4. In the process of fabricating a semiconductor device having a P-N junction terminating at a surface and under an electrically insulating coating on said surface, the steps of:

(a) depositing on said device a compound capable of yielding phosphorous pentoxide upon being heated to a predetermined temperature and which compound also yields a product detrimental to said device;

(b) hermetically sealing said device in a container with a reagent capable of reacting with said product to form a substantially harmless substance; and (c) heating at least said compound to said predetermined temperature.

5. The invention according to claim 4 wherein said compound is ammonium phosphate and said reagent is ammonium nitrate.

6. The invention according to claim 4 wherein said sealing and heating steps are performed simultaneously.

7. The invention according to claim 4 wherein said sealing step is accomplished by heating said container to a temperature which results in heating at least said compound to said predetermined temperature.

8. In the process of fabricating a semiconductor device having a P-N junction terminating at a surface and under an electrically insulating coating on said surface, the steps of:

(a) immersing said device in a solution consisting essentially of:

(1) a compound capable of yielding phosphorous pentoxide upon being heated to a predetermined temperature and which also yields a product detrimental to said device; and (2) a reagent capable of reacting with said product to form a substantially harmless substance;

(b) thereafter assembling said device having deposits thereon of said compound and said reagent into a container; and (c) hermetically sealing said container by heating said container to a temperature which results in heating said compound to said predetermined temperature.

9. The invention according to claim 8 wherein said compound is ammonium phosphate and said reagent is ammonium nitrate.

10. In the process of fabricating a semiconductor device having a P-N junction terminating at a surface and under an electrically insulating coating on said surface, the steps of:

(a) coating said device with a solution which includes a compound capable of yielding phosphorous pentoxide upon being heated to a predetermined temperature;

(b) assembling said coated device in the ultimate container in which said device is to be used, and (c) heating said compound to said predetermined temperature without raising said device to a temperature at which said phosphorous pentoxide would diffuse therein.

11. The invention according to claim 10 wherein said container is heated to an elevated temperature to thereby hermetically seal said container and heat said compound therein to said predetermined temperature.

12. In the process of fabricating a semiconductor device having a P-N junction terminating at a surface and under an electrically insulating coating on said surface, the steps of:

(a) providing said device in a container with:

(1) a compound capable of yielding phosphorous pentoxide upon being heated to a predetermined temperature, and (2) a reagent capable of reacting with any device-detrimental products yielded by said compound to form a harmless substance; and (b) heating at least said compound to said predetermined temperature.

13. The invention according to claim 12 wherein said container is heated to an elevated temperature to thereby hermetically seal said container and heat said compound therein to said predetermined temperature.

14. The invention according to claim 12 wherein said compound is ammonium phosphate and said reagent is ammonium nitrate.

References Cited

UNITED STATES PATENTS

| | | | |
|---|---|---|---|
| 2,974,073 | 3/1961 | Armstrong | 148—188 |
| 3,244,567 | 4/1966 | Crishal et al. | 148—189 |
| 3,334,281 | 8/1967 | Ditrick. | |
| 2,998,557 | 8/1961 | Van Amstel | 29—588 X |
| 3,299,487 | 1/1967 | Cook et al. | 29—588 UX |
| 3,416,224 | 12/1968 | Armstrong et al. | 29—588 X |

JOHN F. CAMPBELL, Primary Examiner

W. TUPMAN, Assistant Examiner

U.S. Cl. X.R.

148—1.5; 317—234 F